(12) United States Patent
Song et al.

(10) Patent No.: US 9,006,970 B2
(45) Date of Patent: Apr. 14, 2015

(54) ORGANIC LIGHT EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Seung-Yong Song, Yongin (KR); Sun-Young Jung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 19 days.

(21) Appl. No.: 13/831,501

(22) Filed: Mar. 14, 2013

(65) Prior Publication Data

US 2014/0132149 A1    May 15, 2014

(30) Foreign Application Priority Data

Nov. 13, 2012  (KR) .......................... 10-2012-0128267

(51) Int. Cl.
| | |
|---|---|
| H01J 1/62 | (2006.01) |
| H01J 63/04 | (2006.01) |
| H05B 33/04 | (2006.01) |
| H01L 51/52 | (2006.01) |
| H01L 27/32 | (2006.01) |
| H05B 33/10 | (2006.01) |

(52) U.S. Cl.
CPC .............. H05B 33/04 (2013.01); H01L 51/524 (2013.01); H01L 27/32 (2013.01); H05B 33/10 (2013.01)

(58) Field of Classification Search
CPC .............. H01L 51/524; H01L 51/5246; H01L 51/5237; H01L 27/32; H01L 23/10; H01J 2209/264; H01J 2329/8645; H01J 2329/867

USPC ................................ 445/24–26; 313/498–512
See application file for complete search history.

(56) References Cited

U.S. PATENT DOCUMENTS

| | | | | |
|---|---|---|---|---|
| 6,081,071 | A  * | 6/2000 | Rogers ........................... | 313/512 |
| 6,605,893 | B2 * | 8/2003 | Ando ............................ | 313/495 |
| 6,717,052 | B2 * | 4/2004 | Wang et al. .................. | 174/381 |
| 6,833,668 | B1 * | 12/2004 | Yamada et al. ............... | 313/505 |
| 6,850,006 | B2 * | 2/2005 | Kim et al. ..................... | 313/512 |
| 7,141,925 | B2 * | 11/2006 | Wittmann et al. ............ | 313/506 |
| 7,193,366 | B2 * | 3/2007 | Tomimatsu et al. .......... | 313/512 |
| 7,749,039 | B2 * | 7/2010 | Park .............................. | 445/24 |
| 7,749,811 | B2 | 7/2010 | Aitken et al. | |

(Continued)

FOREIGN PATENT DOCUMENTS

| | | |
|---|---|---|
| EP | 1 814 177 A2 | 8/2007 |
| EP | 2 234 187 A1 | 9/2010 |

(Continued)

OTHER PUBLICATIONS

EPO Search Report dated Aug. 4, 2014, for corresponding European Patent application 13181447.7, (10 pages).

*Primary Examiner* — Nimeshkumar Patel
*Assistant Examiner* — Jose M Diaz
(74) *Attorney, Agent, or Firm* — Christie, Parker & Hale, LLP

(57) ABSTRACT

An organic light emitting display apparatus includes a base substrate, a light emitting unit on the base substrate and including an organic light emitting element, a driving unit on the base substrate, a sealing substrate opposite from the base substrate, and a sealing unit between the base and sealing substrates and enclosing the light emitting unit, the sealing unit being at least partially on the driving unit.

19 Claims, 6 Drawing Sheets

(56) References Cited

U.S. PATENT DOCUMENTS

| | | | |
|---|---|---|---|
| 7,834,550 B2 * | 11/2010 | Lee et al. | 313/512 |
| 7,837,530 B2 * | 11/2010 | Park | 445/25 |
| 7,923,393 B2 | 4/2011 | Son et al. | |
| 7,944,143 B2 * | 5/2011 | Choi et al. | 313/512 |
| 7,994,534 B2 * | 8/2011 | Kim et al. | 257/100 |
| 8,038,495 B2 * | 10/2011 | Lee et al. | 445/23 |
| 8,063,561 B2 * | 11/2011 | Choi et al. | 313/512 |
| 8,125,146 B2 * | 2/2012 | Park | 313/512 |
| 8,272,913 B2 * | 9/2012 | Yonemoto | 445/25 |
| 8,299,705 B2 * | 10/2012 | Choi | 313/512 |
| 8,390,194 B2 * | 3/2013 | Choi | 313/512 |
| 8,568,184 B2 * | 10/2013 | Prest et al. | 445/25 |
| 8,669,567 B2 * | 3/2014 | Kawakami et al. | 257/83 |
| 2002/0146533 A1 * | 10/2002 | Chung et al. | 428/76 |
| 2003/0122476 A1 * | 7/2003 | Wang et al. | 313/493 |
| 2003/0143423 A1 * | 7/2003 | McCormick et al. | 428/690 |
| 2003/0222575 A1 * | 12/2003 | Yamazaki et al. | 313/504 |
| 2004/0069017 A1 * | 4/2004 | Li et al. | 65/43 |
| 2004/0075380 A1 * | 4/2004 | Takemoto et al. | 313/500 |
| 2004/0095060 A1 * | 5/2004 | Ushifusa et al. | 313/495 |
| 2005/0231107 A1 | 10/2005 | Yamazaki et al. | |
| 2006/0192915 A1 | 8/2006 | Kimura | |
| 2007/0090759 A1 * | 4/2007 | Choi et al. | 313/512 |
| 2007/0176549 A1 * | 8/2007 | Park | 313/512 |
| 2007/0176550 A1 * | 8/2007 | Kwan | 313/512 |
| 2007/0176553 A1 * | 8/2007 | Kwak | 313/512 |
| 2008/0238311 A1 * | 10/2008 | Sung et al. | 313/512 |
| 2010/0013384 A1 * | 1/2010 | Song et al. | 313/504 |
| 2011/0180801 A1 * | 7/2011 | Yamazaki et al. | 257/59 |
| 2012/0104933 A1 * | 5/2012 | Jung et al. | 313/498 |
| 2012/0319574 A1 * | 12/2012 | Kim et al. | 313/512 |
| 2014/0013804 A1 | 1/2014 | Ono et al. | |
| 2014/0062290 A1 * | 3/2014 | Kim | 313/504 |

FOREIGN PATENT DOCUMENTS

| | | |
|---|---|---|
| JP | 2001-319775 | 11/2001 |
| JP | 2002-117972 | 4/2002 |
| KR | 10-2009-0054189 | 5/2009 |
| WO | WO 2012/093698 A1 | 7/2012 |

* cited by examiner

ORGANIC LIGHT EMITTING DISPLAY APPARATUS AND METHOD OF MANUFACTURING THE SAME

CROSS-REFERENCE TO RELATED PATENT APPLICATION

This application claims priority to and the benefit of Korean Patent Application No. 10-2012-0128267, filed on Nov. 13, 2012, in the Korean Intellectual Property Office, the disclosure of which is incorporated herein in its entirety by reference.

BACKGROUND

1. Field

Embodiments of the present invention relate to an organic light emitting display apparatus and method of manufacturing the same.

2. Description of the Related Art

An organic light emitting display apparatus is a self-emission display having a high response speed, as well as a wide angle of field, and high contrast, and therefore attracts attention as a next generation display apparatus.

The organic light emitting display apparatus includes a thin film layer configured of at least one or more organic layers between two electrodes. When exposed to moisture or oxygen, the organic layers deteriorate, causing dark spots that do not emit light.

To reduce or prevent the deterioration of the organic layers, a base substrate on which the organic layers are formed, and a sealing substrate, which seals the organic layers, are adhered to each other with a sealing material. An adhesive containing an organic material to prevent moisture permeation may be used as the sealing material. More commonly, nowadays, frit is used instead as the sealing material, which is an inorganic material that is excellent in blocking of moisture permeation.

SUMMARY

Embodiments of the present invention provide an organic light emitting display apparatus and method of manufacturing the same to enhance capability of blocking moisture permeation and to reduce a dead space.

According to an aspect of embodiments of the present invention, there is provided an organic light emitting display apparatus including a base substrate, a light emitting unit on the base substrate and including an organic light emitting element, a driving unit on the base substrate, a sealing substrate opposite from the base substrate, and a sealing unit between the base and sealing substrates and enclosing the light emitting unit, the sealing unit being at least partially on the driving unit.

The sealing unit may include a low melting inorganic material having a low temperature phase transition (LPT) characteristic.

A phase transition temperature of the low melting inorganic material may be a temperature at which the low melting inorganic material is fluid.

A phase transition temperature of the low melting inorganic material may be lower than a temperature at which electrical characteristics of elements of the driving unit are changed.

A phase transition temperature of the low melting inorganic material may be lower than a temperature at which physical and chemical characteristics of a material of the light emitting unit are changed.

A phase transition temperature of the low melting inorganic material may be from about 80° C. to about 120° C.

The low melting inorganic material may include at least one of tin oxide, stannous fluoride, phosphorous oxide, niobium oxide, boron phosphate, zinc oxide, or tungsten oxide.

The sealing unit may directly contact the driving unit.

The sealing unit may further include a dam unit at both sides of the sealing unit.

The dam unit may include a glass tube.

The sealing unit may further include frit at a side of the sealing substrate stacked with the low melting inorganic material, the low melting inorganic material being at a side of the base substrate.

The sealing substrate may be recessed in a region facing the light emitting unit, and includes a protruding unit protruding along an edge of the sealing substrate, and the low melting inorganic material may be located at the protruding unit.

The base substrate and the sealing substrate may include a glass material.

According to another aspect of embodiments of the present invention, there is provided a method of manufacturing an organic light emitting display apparatus, the method including forming a light emitting unit including an organic light emitting element on a base substrate, and forming a driving unit located outside the light emitting unit on the base substrate, forming a sealing unit including a low melting inorganic material having a low temperature phase transition (LPT) characteristic to enclose the light emitting unit on a sealing substrate, aligning the base and sealing substrates so that the sealing unit at least partially overlaps the driving unit, and bonding the base and sealing substrates such that the low melting inorganic material is at least partially directly joined to the driving unit by heating the low melting inorganic material to a phase transition temperature.

The forming of the sealing unit may include forming a dam unit including two sides of the sealing unit, and filling an inside of the dam unit with the low melting inorganic material.

The forming of the dam unit may include welding a glass tube.

The forming of the sealing unit may include forming frit on the sealing substrate, forming a pyrolysis adhesive on the frit, and forming a pallet including the low melting inorganic material on the pyrolysis adhesive.

The forming of the sealing unit may include irradiating the frit with a laser, decomposing the pyrolysis adhesive with heat, and laminating the frit and low melting inorganic material to directly contact each other.

The pyrolysis adhesive may include at least one of ethyl cellulose, polyimide, or a polyvinyl adhesive.

The method may further include etching a recess unit in the sealing substrate to face the light emitting unit, and forming a protruding unit protruding from an edge of the sealing substrate, before the forming of sealing unit.

The method may further include forming a pallet including the low melting inorganic material on the protruding unit after the forming of the sealing unit.

The phase transition temperature of the low melting inorganic material may be a temperature at which fluidity occurs in the low melting inorganic material.

In the heating of the low melting inorganic material to a phase transition temperature, the phase transition temperature of the low melting inorganic material may be lower than a temperature at which electrical characteristics of elements of the driving unit change.

In the heating of the low melting inorganic material to a phase transition temperature, the phase transition temperature of the low melting inorganic material may be lower than a temperature at which physical and chemical characteristics of a material of the light emitting unit change.

In the heating of the low melting inorganic material to a phase transition temperature, the phase transition temperature of the low melting inorganic material is from about 80° C. to about 120° C.

The low melting inorganic material may include at least one of tin oxide, stannous fluoride, phosphorous oxide, niobium oxide, boron phosphate, zinc oxide, or tungsten oxide.

According to the organic light emitting display apparatus and method of manufacturing the same of embodiments of the present invention, because of a sealing unit including a low melting inorganic material, the electrical elements of the driving unit, or the electrical elements and light emitting material of the light emitting unit are not extensively damaged by moisture or oxygen. Therefore the sealing unit can overlap the driving unit to reduce a dead space.

BRIEF DESCRIPTION OF THE DRAWINGS

The above and other aspects of embodiments of the present invention will become more apparent by describing in detail exemplary embodiments thereof with reference to the attached drawings in which.

DETAILED DESCRIPTION

Figure 1:
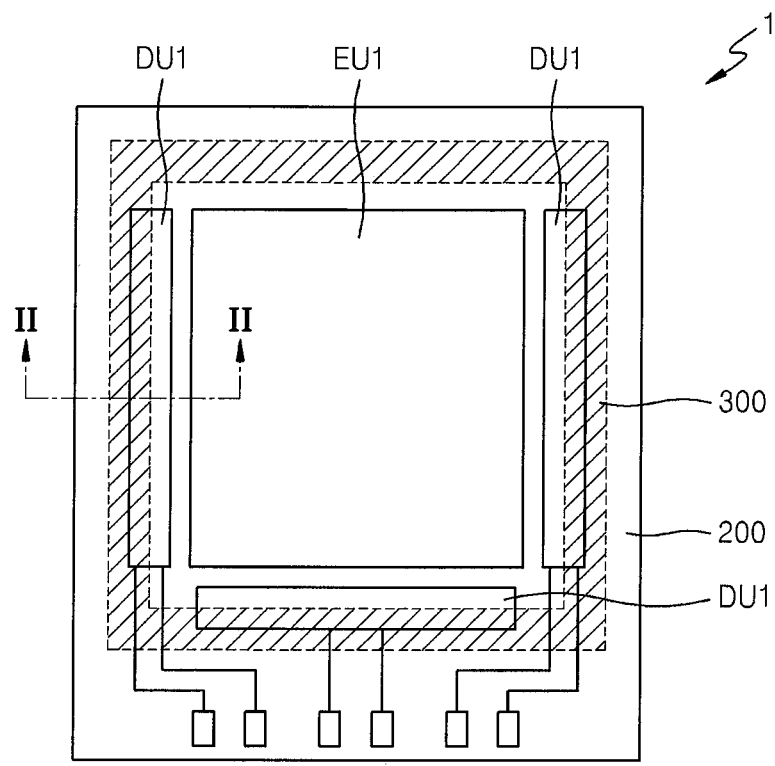
FIG. 1 is a schematic plan view illustrating an organic light emitting display apparatus according to an embodiment of the present invention.

Embodiments of the present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus repetition of their description will be omitted. In the various embodiments, like elements are representatively described in a first embodiment with like reference numerals. In other embodiments, configurations of the elements other than those of the first embodiment are described.

In the drawings, the thicknesses of layers and regions may be exaggerated for clarity. It will also be understood that when a part such as a layer, a film, a region, or a plate is referred to as being "on" another part or substrate, it can be directly on the other part or substrate, or one or more intervening parts may also be present.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," when preceding a list of elements, modify the entire list of elements, and do not modify the individual elements of the list.

Figure 2:
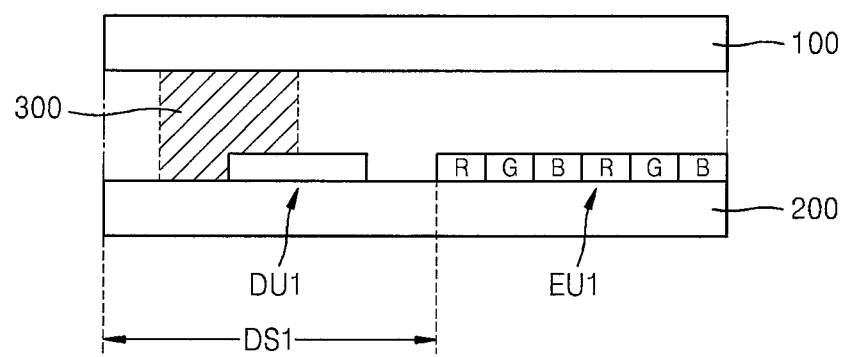
FIG. 2 is a cross-sectional view taken along the line II-II in FIG. 1.

FIG. 1 is a schematic plan view illustrating an organic light emitting display apparatus according to an embodiment of the present invention, and FIG. 2 is a cross-sectional view taken along the line II-II in FIG. 1.

Referring to FIGS. 1 and 2, a light emitting unit EU1 and a driving unit DU1 are formed on a base substrate 200.

The light emitting unit EU1 includes at least one organic light emitting element that emits light when a power supply voltage is applied to an organic layer laminated between positive and negative electrodes. In FIG. 2, the light emitting unit EU1 is illustrated to emit red R, green G and blue B light as an example for the sake of convenience.

The base substrate 200 beneath the light emitting unit EU1 may further include a display unit configured of a plurality of transistors and capacitors for driving the organic light emitting unit. The base substrate 200 may be a substrate which is normally used in the organic light emitting display apparatus, or may be a glass substrate that is excellent in mechanical strength, thermal stability, transparency, surface smoothness, tractability and water-resistance.

The driving unit DU1 is located outside the light emitting unit EU1 on the base substrate 200. For example, the driving unit DU1 transfers an electrical signal to the display unit coupled to the light emitting unit EU1 like a scan driver or a data driver.

In embodiments of the present invention, the term driving unit DU1 is not limited only to the scan driver and data driver, but may include other kinds of circuit units located on the base substrate 200 outside the light emitting unit EU1 that are electrically coupled to the display unit including a power supply, which provides a power source to the organic light emitting unit.

In addition, even though the driving unit DU1 is illustrated as located in left and right sides of, and beneath, the base substrate 200 in FIG. 1, the present invention is not limited thereto, and there may be at least one or more driving units DU1 located on the base substrate 200.

Although not illustrated in detail, the foregoing driving unit DU1 includes Thin Film Transistors (TFTs) and various electrical elements.

When exposed to vapour (e.g., moisture) or oxygen in the air, the organic layer in the organic light emitting unit 1 deteriorates to generate progressive dark spots. Therefore the light emitting unit EU1 in which the organic layer is formed should be sealed thoroughly To block the light emitting unit EU1 from outside, a seal substrate 100 is located opposite to the base substrate 200, and is bonded to the base substrate 200 with a sealing unit 300.

Like the foregoing base substrate 200, the seal substrate 100 may comprise a substrate normally used in the organic light emitting display unit, or a glass substrate having excellent mechanical strength, thermal stability, transparency, surface smoothness, tractability and water-resistance.

When an adhesive containing an organic material is used as the sealing unit 300, moisture blocking capability (for avoiding moisture permeation) is lowered. Therefore frit, which is an inorganic material, may be used as a sealing material.

Figure 3:
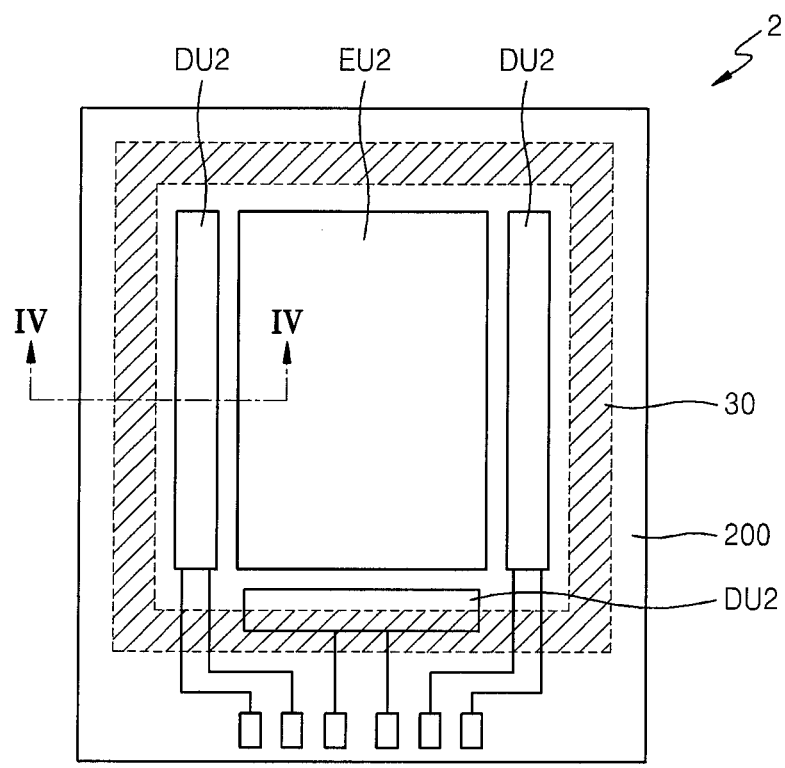
FIG. 3 is a schematic plan view illustrating an organic light emitting display apparatus according to a comparative example of an embodiment of the present invention.
Figure 4:
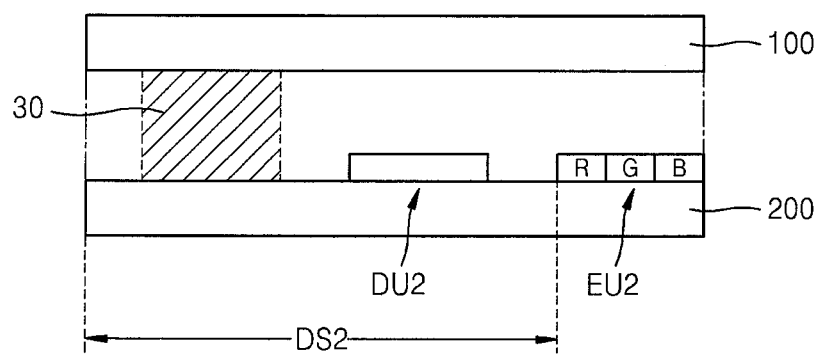
FIG. 4 is a cross-sectional view taken along the line IV-IV in FIG. 3.

Hereinafter, referring to FIGS. 3 and 4, comparative examples in which a sealing unit is made of frit will be described. FIG. 3 is a schematic plan view illustrating an organic light emitting display apparatus according to a comparative example of the present invention, and FIG. 4 is a cross-sectional view taken along the line IV-IV in FIG. 3. Referring FIGS. 3 and 4, a light emitting unit UE2 and a driving unit DU2 are formed on a base substrate 200.

The light emitting unit EU2 includes at least one organic light emitting element that emits light when a power supply voltage is applied to an organic layer laminated between positive and negative electrodes. In FIG. 4, the light emitting unit EU2 is illustrated to emit red R, green G and blue B light as an example for convenience's sake.

The base substrate 200 may be a substrate that is normally used in the organic light emitting display apparatus, or may be a glass substrate having excellent mechanical strength, thermal stability, transparency, surface smoothness, tractability and water-resistance. Furthermore, the sealing substrate 100 may adopt a glass substrate like the base substrate 200.

A driving unit DU2 is located outside the light emitting unit EU2 on the base substrate 200.

The foregoing driving unit DU2 includes TFTs and various electrical elements.

To protect the light emitting unit EU2 from outside (e.g., an exterior environment), the sealing substrate 100 is located to be opposite to the base substrate and the sealing substrate 100 is bonded to the base substrate 200 with a sealing unit 30 made of the frit, which is excellent in reducing or preventing moisture permeation. The sealing substrate 100 may be bonded to the base substrate 200 with a laser. Because a temperature of frit irradiated with the laser sharply increases (e.g., effectively instantly) and damages the driving unit DU2 around the frit, the sealing unit 30 is separated from the driving unit DU2 (e.g., separated by a predetermined interval) in the organic light emitting display apparatus 2 of the comparative example in which the sealing unit made of frit is involved.

Nowadays, as customer demand for a slim display apparatus increases, efforts are directed toward reducing a dead space. When the sealing unit is not separated from, but instead overlaps, the driving unit, the driving unit can be moved to the outskirts of the base substrate. Then an area of the light emitting unit increases, and the overall dead space can be reduced.

However, when the base substrate 200 and sealing substrate 100 are bonded with the sealing unit 30 made of frit, the temperature of the frit irradiated with a high-output laser may go higher than 600° C., as in the comparative example. Therefore the driving unit DU2 is separated from the sealing unit 30 to avoid damage from the high temperature. Accordingly, a dead space between an edge of the base substrate 200 and the light emitting unit EU2 is barely or minimally reduced.

Referring to FIGS. 1 and 2, the present embodiment adopts a low melting inorganic material (e.g., a material having a low temperature phase transition characteristic) instead of frit as the sealing unit 300. Here, a phase transition temperature of the low melting inorganic material indicates the minimum temperature at which fluidity occurs in the low melting inorganic material. Furthermore, the phase transition temperature of the low melting inorganic material may be lower than a temperature at which electrical characteristics of elements configuring the driving unit DU1 begin to change. For example, the phase transition temperature of the low melting inorganic material may be from about 80° C. to about 120° C.

The low melting inorganic material may include for example, one or more kinds of tin oxide, such as SnO, stannous fluoride, such as $SnF_2$, phosphorous oxide, such as $P_2O_5$, niobium oxide, such as NbO, boron phosphate, such as $BPO_4$, zinc oxide, such as ZnO, and tungsten oxide, such as $WO_3$.

Because the sealing unit 300 of the present embodiment softens at a low temperature, and because the bonding of the base substrate 200 and the sealing substrate 100 is also performed at a low temperature, even with use of a laser, the driving unit DU1 and light emitting unit EU1 are not damaged by heat. Accordingly, as shown in FIGS. 1 and 2, the sealing unit 300 is formed to overlap a portion of the driving unit DU1.

Compared to the comparative examples as shown in FIGS. 3 and 4, the driving unit DU1 may be located closer to the sealing unit 300 enabling the dead space to be reduced. Even though only portions of the sealing unit 300 and driving unit DU1 overlap each other in the drawings, the overlapping may be performed in a wider range. As the overlapping region is widened, the area of the light emitting unit EU1 is increased, and the dead space can be further reduced.

According to the present embodiments, because it is not necessary to prepare a separate protection member between the sealing unit 300 and driving unit DU1 to protect the driving unit DU1 from high temperature (e.g., heat applied to the sealing unit 300), the driving unit DU1 can directly contact the sealing unit 300. Therefore, the manufacturing process is simplified.

However, adhesion between the driving unit DU1 and sealing unit 300 may become weak. Here, the low melting inorganic materials may be mixed, for example, in ratios as follows:

i) powder mixture (mole %) of 40% $SnF_2$+40% SnO+20% $P_2O_5$;
ii) mixture (mole %) of 40% $SnF_2$+40% SnO+18% $P_2O_5$+2% $Nb_2O_5$;
iii) mixture (mole %) of 40% SnO+40% $P_2O_5$+20% ZnO;
iv) mixture (mole %) of 40% SnO+40% $P_2O_5$+18% ZnO+2% FeO.

Then adhesion of the sealing unit 300 according to the present embodiment was tested. As the test results, the adhesions of the samples were i) 15 kgf/mm, ii) 27 kgf/mm, iii) 7 kgf/mm, iv) 20 kgf/mm, respectively, confirming that the samples had sufficient adhesions.

Hereinafter various methods for manufacturing an organic light emitting display apparatus will be described.

Figure 5A:
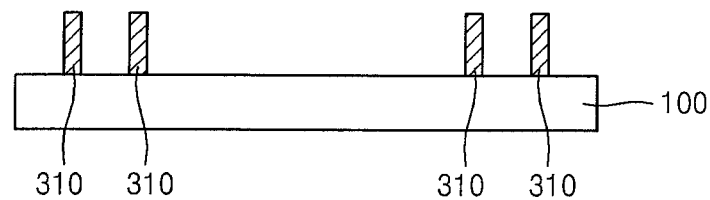
FIGS. 5A to 5C are schematic plan views illustrating a method of manufacturing an organic light emitting display apparatus according to a first embodiment of the present invention.
Figure 5B:
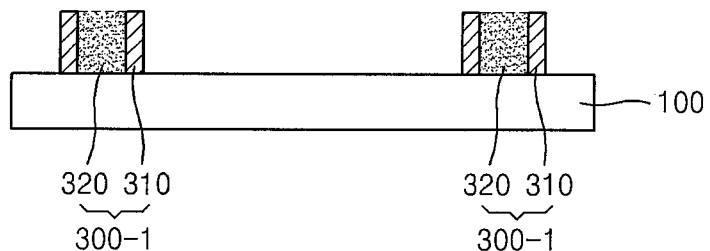
Figure 5C:
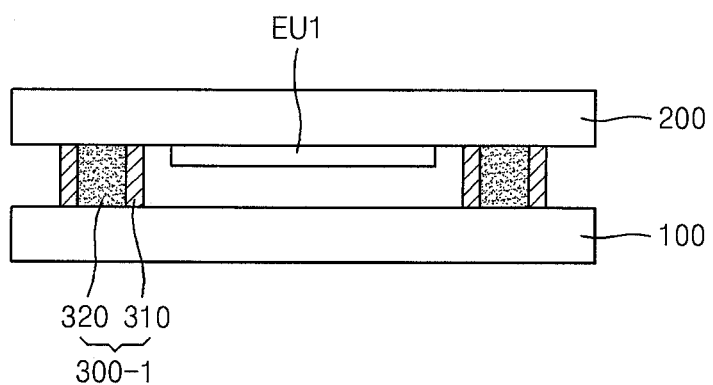

FIGS. 5A to 5C are schematic plan views illustrating a method of manufacturing an organic light emitting display apparatus according to a first embodiment of the present invention.

Referring to FIGS. 5A to 5C, a dam unit 310 is formed doubly on the sealing unit 300 (e.g., the dam unit 310 is form at/as both sides of the sealing unit 300) to enclose the light emitting unit EU1 of the base substrate 200 and to overlap a portion of the driving unit DU1 (see FIG. 1) along an outskirt of a joined line (e.g., a continuous line, or an enclosing structure). The dam unit 310 may be formed by welding a glass tube to the sealing unit 300.

Next, as shown in FIG. 5B, the inside of the dam unit 310 is filled with the low melting inorganic material 320 in a powder state. Then, as shown in FIG. 5C, the base substrate 200 and the sealing substrate 100 are aligned for a joined line of the sealing unit 300-1 to at least partially overlap the driving unit DU1 (see FIG. 1).

After the alignment, the low melting inorganic material 320 is heated at a phase transition temperature, and the base substrate 200 and the sealing substrate 100 are bonded for the low melting inorganic material 320 to be at least partially and directly joined to the driving unit DU1 (see FIG. 1). Accordingly, a low melting inorganic material 320 in the powder state is difficult to contain, or to maintain as a certain shape. Therefore the dam unit 310 is formed to contain the powder, and the powder is put into the dam unit 310 and then heated.

Because high energy is not necessary to glassify (e.g., make into glass) the low melting inorganic material 320 in the powder state, the sealing unit 300-1 including the low melting inorganic material 320 does not damage electrical elements included in the driving unit DU1 (see FIG. 1). Therefore it is possible to design the driving unit DU1 (see FIG. 1) to overlap the sealing unit 300-1, thereby reducing the dead space.

Figure 6A:
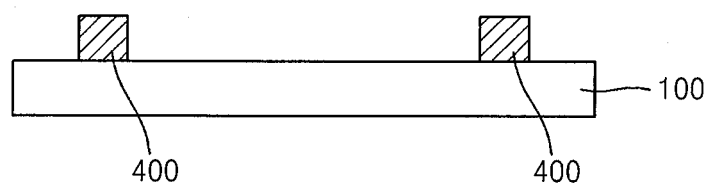
FIGS. 6A to 6E are schematic plan views illustrating a method of manufacturing an organic light emitting display apparatus according to a second embodiment of the present invention.
Figure 6B:
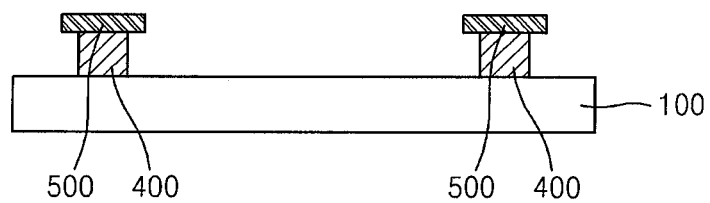
Figure 6C:
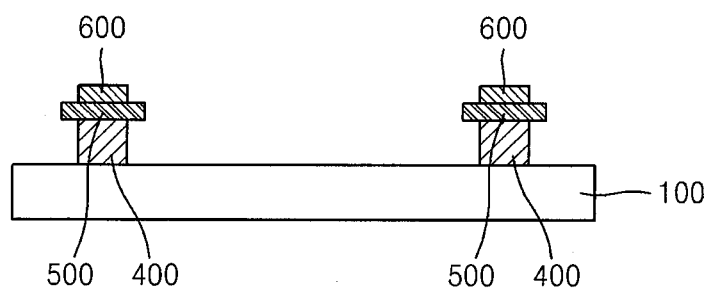

FIGS. 6A to 6C are schematic plan views illustrating a method of manufacturing an organic light emitting display apparatus according to a second embodiment of the present invention.

Referring to FIG. 6A, a frit 400 is formed on the sealing substrate 100.

Referring to FIG. 6B, a pyrolysis adhesive 500 is formed on the frit 400. The pyrolysis adhesive 500 may be made of at least one of ethyl cellulose, polyimide and a polyvinyl adhesive.

Referring to FIG. 6C, a pallet 600 containing the low melting inorganic material is formed on the pyrolysis adhesive 500.

Figure 6D:
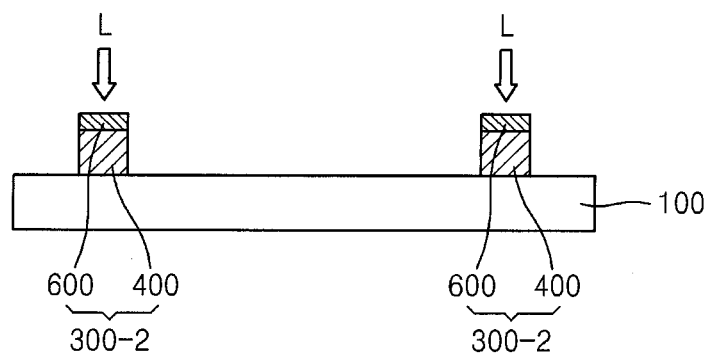

Referring to FIG. 6D, before the sealing substrate 100 is bonded to the base substrate 200, the temperature of the frit 400 is raised by irradiating the frit 400 of the sealing substrate 100 with the laser L. The pyrolysis adhesive 400 is at least partly decomposed by the heat from the frit 400, and a portion of the pallet 600, which contains the low melting inorganic material and touches the frit 400, melts to be integrated to the frit 400, and forms a sealing unit 300-2.

Figure 6E:
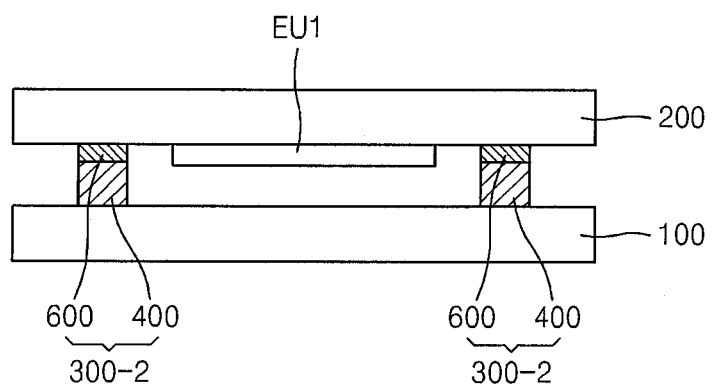

Referring to FIG. 6E, the base substrate 200 and sealing substrate 100 are aligned for a joined line of the sealing unit 300-2 to at least partially overlap the driving unit DU1 (see FIG. 1).

After the alignment, the low melting inorganic material 600 is heated at a phase transition temperature, and the base substrate 200 and the sealing substrate 100 are bonded for the low melting inorganic material 600 to be at least partially and directly joined to the driving unit DU1 (see FIG. 1).

Figure 7A:
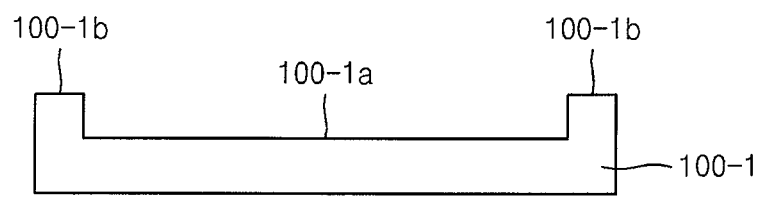
FIGS. 7A to 7C are schematic plan views illustrating a method of manufacturing an organic light emitting display apparatus according to a third embodiment of the present invention.
Figure 7B:
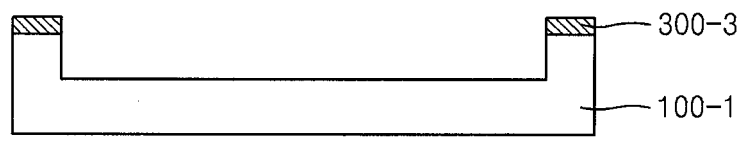
Figure 7C:
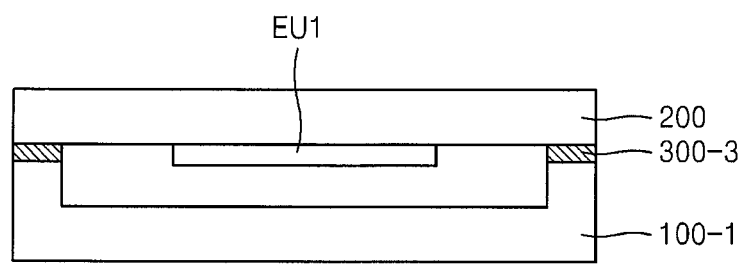

FIGS. 7A to 7C are schematic plan views illustrating a method of manufacturing an organic light emitting display apparatus according to a third embodiment of the present invention.

Referring to FIG. 7A, a recess unit 100-1a and protruding unit 100-1b are formed in the sealing substrate 100-1. The recess unit 100-1a is formed in a region facing the light emitting unit EU1 to be described later, and the protruding unit 100-1b is formed along a joined line (e.g., continuously formed at an edge of the sealing substrate 100-1). The forgoing process may be performed by etching.

Referring to FIG. 7B, a sealing unit 300-3 of a pallet form that contains the low melting inorganic material is formed on the protruding unit 100-1b.

Referring to FIG. 7C, the base substrate 200 and sealing substrate 100 are aligned so that a joined line of the sealing unit 300-3 at least partially overlaps the driving unit DU1 (see FIG. 1).

After the alignment, the sealing unit 300-3 containing the low melting inorganic material is heated at a phase transition temperature, and the base substrate 200 and the sealing substrate 100 are bonded for the sealing unit 300-3 to be at least partially and directly joined to the driving unit DU1 (see FIG. 1).

According to the foregoing first to third embodiments, because the sealing unit containing the low melting inorganic material is used, the electrical elements of the driving unit, and electrical elements of a light emitting material, are not damaged even though heat is applied while bonding the base substrate to the sealing substrate.

Therefore the sealing unit can be formed to overlap the driving unit, thereby reducing the dead space. In addition, it is not necessary to form a protection member to protect the driving unit between the driving unit and the sealing unit, thereby simplifying the manufacturing process.

While embodiments of the present invention have been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. An organic light emitting display apparatus comprising:
   a base substrate;
   a light emitting unit on the base substrate and comprising an organic light emitting element;
   a driving unit on the base substrate;
   a sealing substrate opposite from the base substrate; and
   a sealing unit between the base and sealing substrates and enclosing the light emitting unit, the sealing unit being at least partially on the driving unit,
   wherein the sealing unit comprises a low melting inorganic material having a low temperature phase transition (LPT) characteristic,
   wherein the sealing unit further comprises a dam unit at both sides of the sealing unit, and
   wherein the dam unit comprises a glass tube.

2. The organic light emitting display apparatus according to claim 1, wherein a phase transition temperature of the low melting inorganic material is a temperature at which the low melting inorganic material is fluid.

3. The organic light emitting display apparatus according to claim 1, wherein a phase transition temperature of the low melting inorganic material is lower than a temperature at which electrical characteristics of elements of the driving unit are changed.

4. The organic light emitting display apparatus according to claim 1, wherein a phase transition temperature of the low melting inorganic material is lower than a temperature at which physical and chemical characteristics of a material of the light emitting unit are changed.

5. The organic light emitting display apparatus according to claim 1, wherein a phase transition temperature of the low melting inorganic material is from about 80° C. to about 120° C.

6. The organic light emitting display apparatus according to claim 1, wherein the low melting inorganic material comprises at least one of tin oxide, stannous fluoride, phosphorous oxide, niobium oxide, boron phosphate, zinc oxide, or tungsten oxide.

7. The organic light emitting display apparatus according to claim 1, wherein the sealing unit directly contacts the driving unit.

8. An organic light emitting display apparatus comprising:
a base substrate;
a light emitting unit on the base substrate and comprising an organic light emitting element;
a driving unit on the base substrate;
a sealing substrate opposite from the base substrate; and
a sealing unit between the base and sealing substrates and enclosing the light emitting unit, the sealing unit being at least partially on the driving unit,
wherein the sealing unit comprises a low melting inorganic material having a low temperature phase transition (LPT) characteristic, and
wherein the sealing unit further comprises frit at a side of the sealing substrate stacked with the low melting inorganic material, the low melting inorganic material being at a side of the base substrate.

9. The organic light emitting display apparatus according to claim 1, wherein the base substrate and the sealing substrate comprise a glass material.

10. A method of manufacturing an organic light emitting display apparatus, the method comprising:
forming a light emitting unit comprising an organic light emitting element on a base substrate, and forming a driving unit located outside the light emitting unit on the base substrate;
forming a sealing unit comprising a low melting inorganic material having a low temperature phase transition (LPT) characteristic to enclose the light emitting unit on a sealing substrate;
aligning the base and sealing substrates so that the sealing unit at least partially overlaps the driving unit; and
bonding the base and sealing substrates such that the low melting inorganic material is at least partially directly joined to the driving unit by heating the low melting inorganic material to a phase transition temperature,
wherein the forming of the sealing unit comprises:
forming a dam unit comprising two sides of the sealing unit; and
filling an inside of the dam unit with the low melting inorganic material, and
wherein the forming of the dam unit comprises welding a glass tube on the sealing substrate.

11. A method of manufacturing an organic light emitting display apparatus, the method comprising:
forming a light emitting unit comprising an organic light emitting element on a base substrate, and forming a driving unit located outside the light emitting unit on the base substrate;
forming a sealing unit comprising a low melting inorganic material having a low temperature phase transition (LPT) characteristic to enclose the light emitting unit on a sealing substrate;
aligning the base and sealing substrates so that the sealing unit at least partially overlaps the driving unit; and
bonding the base and sealing substrates such that the low melting inorganic material is at least partially directly joined to the driving unit by heating the low melting inorganic material to a phase transition temperature,
wherein the forming of the sealing unit comprises:
forming frit on the sealing substrate;
forming a pyrolysis adhesive on the frit; and
forming a pallet including the low melting inorganic material on the pyrolysis adhesive.

12. The method of manufacturing an organic light emitting display apparatus according to claim 11, wherein the forming of the sealing unit comprises irradiating the frit with a laser, decomposing the pyrolysis adhesive with heat, and laminating the frit and low melting inorganic material to directly contact each other.

13. The method of manufacturing an organic light emitting display apparatus according to claim 11, wherein the pyrolysis adhesive comprises at least one of ethyl cellulose, polyimide, or a polyvinyl adhesive.

14. A method of manufacturing an organic light emitting display apparatus, the method comprising:
forming a light emitting unit comprising an organic light emitting element on a base substrate, and forming a driving unit located outside the light emitting unit on the base substrate;
forming a sealing unit comprising a low melting inorganic material having a low temperature phase transition (LPT) characteristic to enclose the light emitting unit on a sealing substrate;
aligning the base and sealing substrates so that the sealing unit at least partially overlaps the driving unit; and
bonding the base and sealing substrates such that the low melting inorganic material is at least partially directly joined to the driving unit by heating the low melting inorganic material to a phase transition temperature;
etching a recess unit in the sealing substrate to face the light emitting unit;
forming a protruding unit protruding from an edge of the sealing substrate, before the forming of sealing unit; and
forming a pallet comprising the low melting inorganic material on the protruding unit after the forming of the sealing unit.

15. The method of manufacturing an organic light emitting display apparatus according to claim 10, wherein the phase transition temperature of the low melting inorganic material is a temperature at which fluidity occurs in the low melting inorganic material.

16. The method of manufacturing an organic light emitting display apparatus according to claim 10, wherein in the heating of the low melting inorganic material to a phase transition temperature, the phase transition temperature of the low melting inorganic material is lower than a temperature at which electrical characteristics of elements of the driving unit change.

17. The method of manufacturing an organic light emitting display apparatus according to claim 10, wherein in the heating of the low melting inorganic material to a phase transition temperature, the phase transition temperature of the low melting inorganic material is lower than a temperature at which physical and chemical characteristics of a material of the light emitting unit change.

18. The method of manufacturing an organic light emitting display apparatus according to claim 10, wherein in the heating of the low melting inorganic material to a phase transition temperature, the phase transition temperature of the low melting inorganic material is from about 80° C. to about 120° C.

19. The method of manufacturing an organic light emitting display apparatus according to claim 10, wherein the low melting inorganic material comprises at least one of tin oxide, stannous fluoride, phosphorous oxide, niobium oxide, boron phosphate, zinc oxide, or tungsten oxide.

* * * * *